US010497882B2

(12) United States Patent
Guo

(10) Patent No.: US 10,497,882 B2
(45) Date of Patent: Dec. 3, 2019

(54) LIGHT EMITTING DIODE AND METHOD OF FABRICATING THE SAME

(71) Applicant: NATIONAL CHENG KUNG UNIVERSITY, Tainan (TW)

(72) Inventor: Tzung-fang Guo, Tainan (TW)

(73) Assignee: National Cheng Kung University, Tainan (TW)

( * ) Notice: Subject to any disclaimer, the term of this patent is extended or adjusted under 35 U.S.C. 154(b) by 290 days.

(21) Appl. No.: 15/589,061

(22) Filed: May 8, 2017

(65) Prior Publication Data

US 2018/0033976 A1 Feb. 1, 2018

Related U.S. Application Data

(60) Provisional application No. 62/369,331, filed on Aug. 1, 2016.

(51) Int. Cl.
*H01L 51/50* (2006.01)
*H01L 51/00* (2006.01)

(52) U.S. Cl.
CPC ...... *H01L 51/0077* (2013.01); *H01L 51/0003* (2013.01); *H01L 51/0008* (2013.01); *H01L 51/0029* (2013.01); *H01L 51/0035* (2013.01); *H01L 51/0037* (2013.01); *H01L 51/5012* (2013.01); *H01L 51/5056* (2013.01); *H01L 51/5072* (2013.01); *H01L 2251/303* (2013.01)

(58) Field of Classification Search
None
See application file for complete search history.

(56) References Cited

U.S. PATENT DOCUMENTS

| 6,420,056 B1 * | 7/2002 | Chondroudis | B82Y 10/00 313/502 |
|---|---|---|---|
| 9,362,453 B2 | 6/2016 | Chao et al. | |
| 2015/0249170 A1 | 9/2015 | Snaith et al. | |
| 2016/0002392 A1 | 1/2016 | Liaw et al. | |
| 2017/0084841 A1 | 3/2017 | Blouin et al. | |

FOREIGN PATENT DOCUMENTS

| CN | 105024012 A | 11/2015 |
|---|---|---|
| CN | 105336856 A | 2/2016 |
| CN | 105552185 A | 5/2016 |
| TW | 201608007 A | 3/2016 |
| WO | 2015149905 A1 | 8/2015 |
| WO | 2016072092 A1 | 5/2016 |
| WO | 2016110851 A1 | 7/2016 |

OTHER PUBLICATIONS

Zhongmin Zhou, et al. Methylamine-Gas-Induced Defect-Healing Behavior of CH3NH3PbI3 Thin Films for Perovskite Solar Cells. p. 9705-9709, (2015).
Yuanyuan Zhou,et al. Exceptional Morphology-Preserving Evolution of Formamidinium Lead Triiodide Perovskite Thin Films via Organic-Cation Displacement. p. 5535-5538.

* cited by examiner

*Primary Examiner* — Gregory D Clark
(74) *Attorney, Agent, or Firm* — Muncy, Geissler, Olds & Lowe, P.C.

(57) ABSTRACT

A light emitting diode and a method of fabricating the same are described. The light emitting diode has: a hole transport layer, an active layer and an electron transport layer. The active layer is disposed on the hole transport layer, and the active layer has a mesophase structure of an organic amine compound and a perovskite structure compound. The electron transport layer is disposed on the active layer.

10 Claims, 3 Drawing Sheets

LIGHT EMITTING DIODE AND METHOD OF FABRICATING THE SAME

CROSS REFERENCE TO RELATED APPLICATION

This application claims priority to U.S. Provisional Application No. 62/369,331, filed Aug. 1, 2016, titled "NiO$_x$ electrode interlayer and CH$_3$NH$_2$/CH$_3$NH$_3$PbBr$_3$ interface treatment to markedly advance hybrid perovskite-based light-emitting diodes", which is incorporated herein by reference in its entirety.

FIELD OF THE DISCLOSURE

The present disclosure relates to a diode and a method of fabricating the same, and more particularly to a light emitting diode and a method of fabricating the same.

BACKGROUND OF THE DISCLOSURE

Currently, dye-sensitized solar cells (DSSC) have been developed to use an organic-inorganic hybrid perovskite crystalline material, methylammonium lead iodide (CH$_3$NH$_3$PbI$_3$), as a dye-sensitized light-absorbing layer, and organic polymers including (Poly (3,4-ethylenedioxythiophene): poly(styrene-sulfonate) (PEDOT: PSS) as a hole transport layer to prepare a solid state DSSC. However, a perovskite structure can also be used as an active layer of a light emitting diode for emitting a light. In general, the conventional light emitting diode with the perovskite structure cannot achieve a satisfying requirement on a highest luminous intensity and a luminous efficiency.

Therefore, there is still room for improvement on the highest luminous intensity and the luminous efficiency of the conventional light emitting diode. As a result, it is necessary to provide a light emitting diode and a method of fabricating the same, so as to solve the problems existing in the conventional technologies, as described above.

SUMMARY OF THE DISCLOSURE

An object of the present disclosure is to provide a light emitting diode, which uses an active layer with a mesophase structure (also referred to as an intermediate structure) to improve a luminous intensity and a luminous efficiency of the light emitting diode.

Another object of the present disclosure is to provide a method of fabricating a light emitting diode, which uses an organic amine compound gas to perform a modifying step on a perovskite structure compound layer, so as to form an active layer with a mesophase structure of an organic amine compound and a perovskite structure compound. Therefore, a luminous intensity and a luminous efficiency of the resulting light emitting diode are improved.

In order to achieve the above object, the present disclosure provides a light emitting diode, comprising: a hole transport layer, an active layer, and an electron transport layer. The active layer is disposed on the hole transport layer, wherein the active layer has a mesophase structure of an organic amine compound and a perovskite structure compound. The electron transport layer is disposed on the active layer.

In one embodiment of the present disclosure, the hole transport layer is formed of nickel oxide.

In one embodiment of the present disclosure, the electron transport layer is formed of TPBi, Bphen, BCP, TpPyPB, DPPS, or ZnO.

In one embodiment of the present disclosure, the organic amine compound is selected from alkylamine or alkylenediamine.

In one embodiment of the present disclosure, a structural formula of the perovskite structure compound is AMX$_3$, wherein the A is selected from group IA metal, H, NH$_4$, alkylamine, or alkylenediamine; the M is Pb, Sn, or Ge; and the X is Cl, Br, or I.

In order to achieve the above object, the present disclosure provides a method of fabricating a light emitting diode, comprising steps of: providing a hole transport layer; forming a perovskite structure compound layer on the hole transport layer; performing a modifying step, by an organic amine compound gas, on the perovskite structure compound layer to form an active layer, wherein the active layer has a mesophase structure of an organic amine compound and a perovskite structure compound; and forming an electron transport layer on the active layer.

In one embodiment of the present disclosure, the organic amine compound gas is selected from alkylamine gas or alkylenediamine gas.

In one embodiment of the present disclosure, the hole transport layer is formed of nickel oxide, wherein the nickel oxide is NiO, Ni$_2$O$_3$ or a complex thereof.

In one embodiment of the present disclosure, the electron transport layer is formed of TPBi, Bphen, BCP, TpPyPB, DPPS, or ZnO.

In one embodiment of the present disclosure, a structural formula of the perovskite structure compound is AMX$_3$, wherein A is selected from group IA metal, H, NH$_4$, alkylamine, or alkylenediamine; M is Pb, Sn, or Ge; and X is Cl, Br, or I.

DETAILED DESCRIPTION OF THE PREFERRED EMBODIMENTS

The structure and the technical means adopted by the present disclosure to achieve the above and other objects can be best understood by referring to the following detailed description of the preferred embodiments and the accompanying drawings. Furthermore, directional terms described by the present disclosure, such as upper, lower, front, back, left, right, inner, outer, side, longitudinal/vertical, transverse/horizontal, etc., are only directions by referring to the accompanying drawings, and thus the used directional terms are used to describe and understand the present disclosure, but the present disclosure is not limited thereto.

Figure 1:
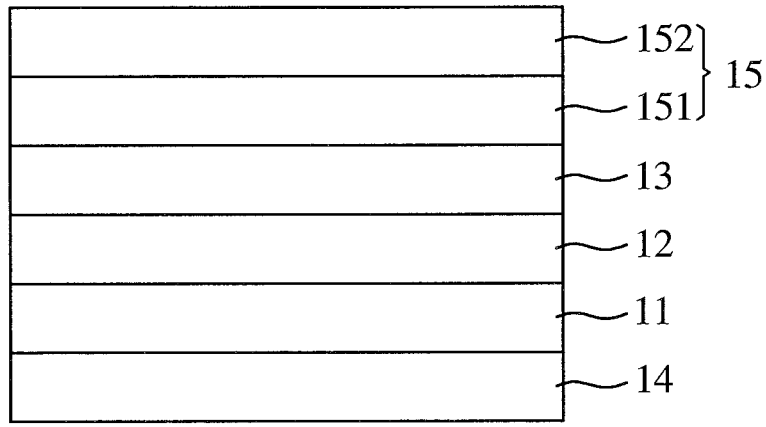
FIG. 1 is a cross-sectional schematic diagram of a light emitting diode according to one embodiment of the present disclosure.

Please refer to FIG. 1, which is a cross-sectional schematic diagram of a light emitting diode 10 according to one embodiment of the present disclosure. In one embodiment of the present disclosure, the light emitting diode 10 includes a hole transport layer 11, an active layer 12, and an electron transport layer 13. In one embodiment, the hole transport layer 11 can be disposed on a transparent conductive substrate 14. For example, the transparent conductive substrate 14 is formed by coating Indium tin oxide (ITO) on a glass substrate. In one embodiment, a commercially available PEDOT:PSS (poly(3,4-ethylenedioxythiophene)/poly(styrenesulfonate)) can be used as the hole transport layer 11. In another embodiment, the hole transport layer cab be formed of nickel oxide ($NiO_x$), such as NiO, $Ni_2O_3$ or a complex thereof. In another embodiment, a thickness of the hole transport layer 11 is ranged from 0.1 nm to 5 nm (e.g., 1 nm).

The active layer 12 is disposed on the hole transport layer 11, wherein the active layer 12 has a mesophase structure of an organic amine compound and a perovskite structure compound. In one embodiment, the active layer 12 is used to produce a light. In another embodiment, the organic amine compound can be selected from alkylamine ($R_nNH_2$) or alkylenediamine ($R_n(NH_2)_2$). The alkylamine is, for example, Methylamine (MA; $CH_3NH_2$). In one embodiment, the perovskite structure compound includes methylamine lead halide ($CH_3NH_3PbX_3$), wherein X is Cl, Br, or I. In one embodiment, a thickness of the active layer 12 is ranged from 380 nm to 400 nm (e.g., 390 nm). In another embodiment, a structural formula of the perovskite structure compound is $AMX_3$, wherein the A is selected from group IA metal (Li, Na, K, Rb, or Cs), H, $NH_4$, alkylamine ($R_nNH_2$, n=1, 2, 3, or a positive integer greater than 3) or alkylenediamine ($R_n(NH_2)_2$, n=1, 2, 3, or a positive integer greater than 3); the M is Pb, Sn, or Ge; and the X is Cl, Br, or I.

It is noted that, of the term "mesophase structure" or "intermediate structure" means that a structure is formed after the perovskite structure compound is modified by an organic amine compound. For example, a mesophase structure of $CH_3NH_2/CH_3NH_3PbX_3$ is obtained by using a methylamine gas to modify a methylamine lead halide.

The electron transport layer 13 is disposed on the active layer 12. In one embodiment, the electron transport layer 13 can be formed of TPBi (1,3,5-tris(1-phenyl-1H-benzimidazol-2-yl)benzene), Bphen, BCP, TpPyPB, DPPS, or ZnO. It is to be noted that other materials commonly used in the electron transport layer 13 in the art may also be used. In one embodiment, a thickness of the electron transport layer 13 is, for example, ranged from 1 to 1000 nm. For example, the thickness can be 50 nm, 100 nm, 200 nm, 500 nm, or 750 nm.

In one embodiment, an electrode 15 can be disposed on the electron transport layer 13. For example, a lithium fluoride (LiF) layer 151 and an aluminum (Al) layer 152 is sequentially stacked on the electron transport layer 13. In one embodiment, a thickness of the lithium fluoride layer 151 is ranged from 0.8 to 1.2 nm (e.g., 0.9 nm, 1.0 nm, or 1.1 nm). In another embodiment, a thickness of the aluminum layer 152 is ranged from 70 to 100 nm (e.g., 75 nm, 80 nm, 85 nm, 90 nm, or 95 nm).

Figure 2:
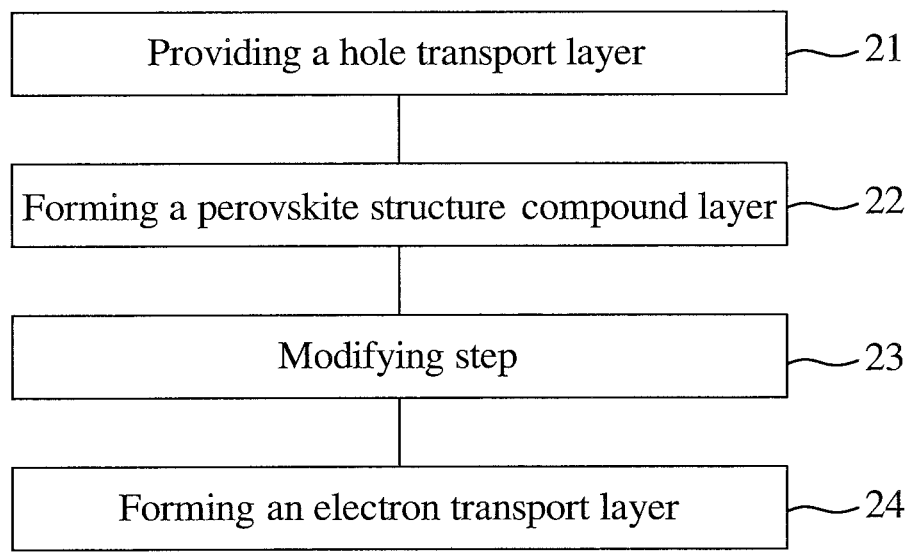
FIG. 2 is a flow chart of a method of fabricating a light emitting diode according to one embodiment of the present disclosure.

Please referring to FIGS. 1 and 2. FIG. 2 is a flow chart of a method 20 of fabricating a light emitting diode according to one embodiment of the present disclosure. In one embodiment of the present disclosure, the method 20 of fabricating the light emitting diode 10 mainly includes the following steps 21 to 24 of: providing a hole transport layer 11 (step 21); forming a perovskite structure compound layer on the hole transport layer 11 (step 22); performing a modifying step, by an organic amine compound gas, on the perovskite structure compound layer to form an active layer 12, wherein the active layer 12 has a mesophase structure of an organic amine compound and a perovskite structure compound (step 23); and forming an electron transport layer 13 on the active layer 12 (step 24). The implementation details of the above-described steps and the principles thereof will be described in detail below.

At first, the method 20 of fabricating the light emitting diode 10 of one embodiment of the present disclosure has the step 21 of: providing a hole transport layer 11. In step 21, the hole transport layer 11 is formed on a transparent conductive substrate 14. For example, the transparent conductive substrate 14 is formed by coating Indium tin oxide (ITO) on a glass substrate. In one embodiment, a commercially available PEDOT:PSS (poly(3,4-ethylenedioxythiophene)/poly(styrenesulfonate)) can be used as the hole transport layer 11. In another embodiment, the hole transport layer cab be formed of nickel oxide ($NiO_x$), such as NiO, $Ni_2O_3$ or a complex thereof.

In another embodiment, a thickness of the hole transport layer 11 is ranged from 0.1 nm to 5 nm (e.g., 1 nm). Specifically, for example, a nickel dicarboxylate (Ni(H-COO)$_2$) powder (or other organic metal salt powders, such as an organic nickel salt powder, an organic copper salt powder or an organic gold salt powder) is put in a container, and ethylene glycol (or other alcohols), ethanolamine and ethylenediamine solvents are added into the container. After stirring and dissolving, an organic metal gel solution is formed. Thereafter, the organic metal gel solution is spin-coated on the transparent conductive substrate 14 at a rotation speed of 4500 RPM for 90 seconds. Then, the coated transparent conductive substrate 14 is heated in an air atmosphere or an oxygen atmosphere at a temperature from 10 to 1000° C. (e.g., about 400° C.) for about 1 to 600 minutes (for example, about 10 minutes), so as to achieve the flat hole transport layer 11. In another embodiment, a thickness of the hole transport layer 11 is ranged from 0.1 nm to 5 nm (e.g., 1 nm).

Then, the method 20 of fabricating the light emitting diode 10 of one embodiment of the present disclosure has the step 22 of: forming a perovskite structure compound layer on the hole transport layer 11. In step 22, for example, $CH_3NH_3Br$ powder and $PbBr_2$ powder can be mixed at a molar ration of 1.05:1 and added into a solvent (such as N,N-Dimethylmethanamide, Dimethyl sulfoxide(DMSO) or γ-Butyrolactone), so as to prepare a mixed solution of 50% by weight. Thereafter, the mixed solution is spin-coated on the hole transport layer 11 and heated at a temperature from 50 to 500° C. (e.g., about 90° C.) for about 1 to 1000 minutes (for example, about 10 minutes). In one embodiment, the spin-coated process can be divided into two stages. For example, a first stage has a rotation speed of 10-3000 RPM (e.g., 500 RPM) for 1-7 seconds (e.g., 7 seconds); and a second stage has a rotation speed of 3000-10000 RPM (e.g., 3000 RPM) for 1-1000 seconds (e.g., 90 seconds), wherein when the second stage is at 60 seconds, an organic solvent (chlorobenzene, benzene, toluene, diethyl ether, hexane, cyclohexane, chloroform, dichloromethane, or trichloromethane) can be added for washing the mixed solution spin-coated on the hole transport layer 11, so as to improve a rapid precipitation of $CH_3NH_3PbBr_2$.

Then, the method 20 of fabricating the light emitting diode 10 of one embodiment of the present disclosure has the step 23 of: performing a modifying step, by an organic amine compound gas, on the perovskite structure compound layer to form an active layer 12, wherein the active layer 12 has a mesophase structure of an organic amine compound and a perovskite structure compound. In step 23, the organic amine compound gas is selected from alkylamine ($R_nNH_2$) gas or alkylenediamine ($Rn(NH_2)_2$) gas. For example, a solid-state strong alkali (e.g., potassium hydroxide, sodium hydroxide) can be reacted with a solid-state alkylamine halide (e.g., $CH_3NH_2Cl$) to form an alkylamine ($R_nNH_2$) gas (e.g., methylamine gas); or a solid-state strong alkali (e.g., potassium hydroxide, sodium hydroxide) can be reacted with a solid-state alkyl diamine halide to form an alkyl diamine ($Rn(NH_2)_2$) gas. It is noted that, when a solid-state potassium hydroxide is reacted with a solid-state $CH_3NH_2Cl$, a water vapor is generated. Therefore, a water-absorbing agent (e.g., calcium oxide) can further be used to adsorb the water vapor in the modifying step. In one embodiment, the above reaction of producing the alkylamine gas (or the alkylenediamine gas) and the modifying step can be performed in a closed environment. In one embodiment, a thickness of the active layer 12 is such as ranged from 380 to 400 nm (e.g., 390 nm). In one embodiment, the modifying step is performed for a time ranged from 0.1 to 1000 seconds.

Finally, the method 20 of fabricating the light emitting diode 10 of one embodiment of the present disclosure has the step 24 of: forming an electron transport layer 13 on the active layer 12. In one embodiment, a material selected from TPBi, Bphen, BCP, TpPyPB, DPPS, or ZnO can be vapor-deposited on the active layer 12 by a commercially available vacuum thermal evaporator, so as to form the electron transport layer 13. In one embodiment, a thickness of the electron transport layer 13 is, for example, ranged from 1 to 1000 nm (e.g., 50 nm).

In one embodiment, an electrode 15 can be formed on the electron transport layer 13 by using a vapor-deposition method. For example, a lithium fluoride layer 151 and an aluminum layer 152 is sequentially stacked on the electron transport layer 13. In one embodiment, a thickness of the lithium fluoride layer 151 is ranged from 0.8 to 1.2 nm, and a thickness of the aluminum layer 152 is ranged from 70 to 100 nm.

Figure 3A:
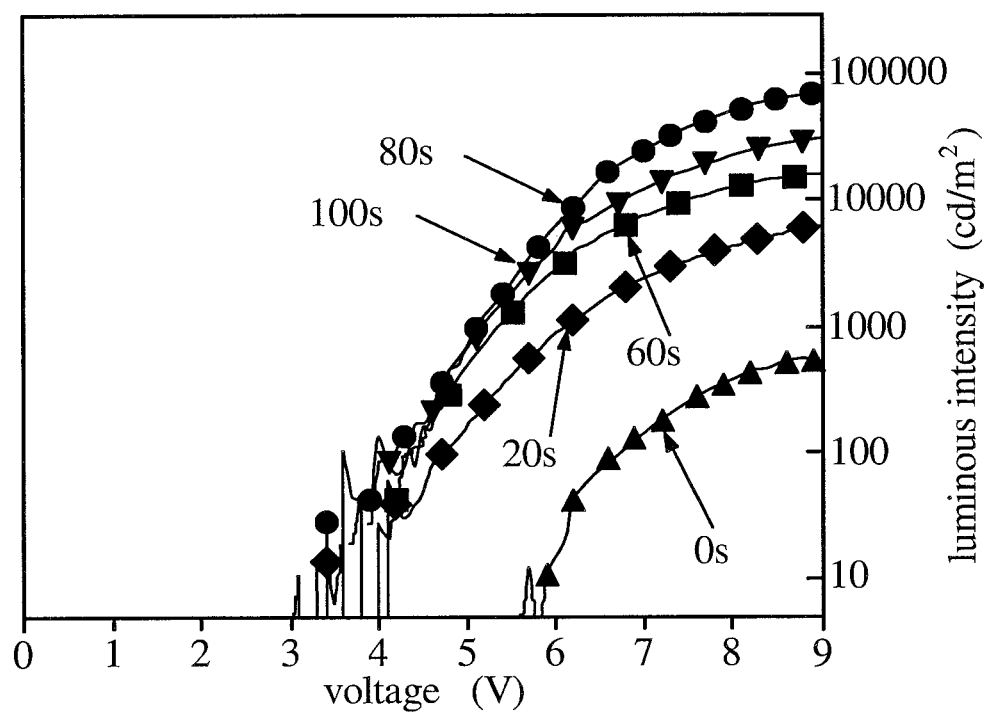
FIG. 3A is an experimental data diagram of luminous intensity versus voltage, during the modifying step, which is performed using different times (20 seconds, 60 seconds, 80 seconds, and 100 seconds, respectively).
Figure 3B:
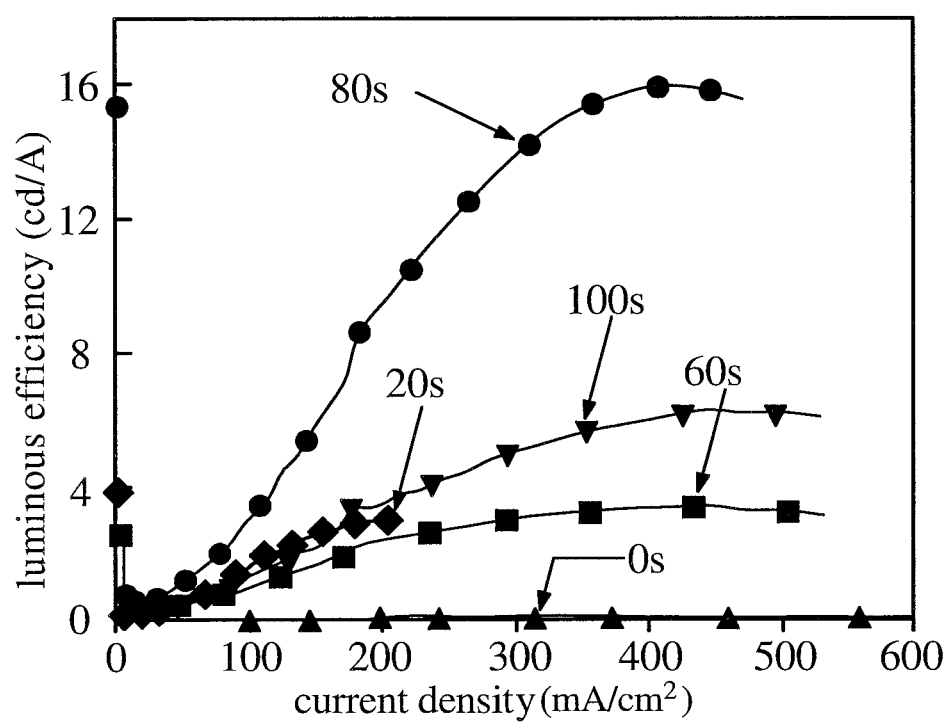
FIG. 3B is an experimental data diagram of luminous efficiency versus current density, during the modifying step, which is performed using different times (20 seconds, 60 seconds, 80 seconds, and 100 seconds, respectively).

Please refer to FIGS. 3A and 3B. FIG. 3A is an experimental data diagram of luminous intensity versus voltage, during the modifying step which is performed using different times (20 seconds, 60 seconds, 80 seconds, and 100 seconds, respectively); and FIG. 3B is an experimental data diagram of luminous efficiency versus current density, during the modifying step which is performed using different times (20 seconds, 60 seconds, 80 seconds, and 100 seconds, respectively). It is noted that, the experimental data in FIGS. 3A and 3B also includes an experimental data without performing the modifying step (i.e., 0 seconds) as a comparative example.

As can be seen from FIGS. 3A and 3B, a light turn-on voltage of the comparative example is about 5.8 V, and light turn-on voltages of the embodiments are all smaller than 4 V. The comparative example has a luminous efficiency of 0.07 cd/A and has a highest luminous intensity of 583.0 $cd/m^2$ upon a voltage being 9.0 V In one embodiment of performing the modifying step for 20 seconds, a luminous efficiency is 3.1 cd/A and a highest luminous intensity is 6670.0 $cd/m^2$ upon a voltage being 9.0 V. In one embodiment of performing the modifying step for 60 seconds, a luminous efficiency is 3.14 cd/A, and a highest luminous intensity is 16900 $cd/m^2$ upon a voltage being 9.0 V. In one embodiment of performing the modifying step for 80 seconds, a luminous efficiency is 15.9 cd/A and a highest luminous intensity is 65300 $cd/m^2$ upon a voltage being 9.0 V. In one embodiment of performing the modifying step for 100 seconds, a luminous efficiency is 6.04 cd/A and a highest luminous intensity is 31900 $cd/m^2$ upon a voltage being 9.0 V. From above, the embodiments of the present disclosure can indeed improve the luminous efficiency and the luminous intensity of the resulting light emitting diode by the modifying step. Further, it is noted that, when the modifying step is performed for 80 seconds, the highest luminous intensity and the luminous efficiency of the embodiment of the present disclosure are respectively far more than the highest luminous intensity (20000 $cd/m^2$) and the luminous efficiency (5 cd/A) of the conventional technology.

The present disclosure has been described with a preferred embodiments thereof and it is understood that many changes and modifications to the described embodiment can be carried out without departing from the scope and the spirit of the disclosure that is intended to be limited only by the appended claims.

What is claimed is:

1. A light emitting diode, comprising:
   a hole transport layer;
   an active layer disposed on the hole transport layer, wherein the active layer has a mesophase structure of an organic amine compound and a perovskite structure compound; and
   an electron transport layer disposed on the active layer.

2. The light emitting diode according to claim 1, wherein the hole transport layer is formed of nickel oxide.

3. The light emitting diode according to claim 1, wherein the electron transport layer is formed of TPBi, Bphen, BCP, TpPyPB, DPPS, or ZnO.

4. The light emitting diode according to claim 1, wherein the organic amine compound is selected from alkylamine or alkylenediamine.

5. The light emitting diode according to claim 1, wherein a structural formula of the perovskite structure compound is $AMX_3$, wherein the A is selected from group IA metal, H, $NH_4$, alkylamine, or alkylenediamine; the M is Pb, Sn, or Ge; and the X is Cl, Br, or I.

6. A method of fabricating a light emitting diode, comprising steps of:
   providing a hole transport layer;
   forming a perovskite structure compound layer on the hole transport layer;
   performing a modifying step, by an organic amine compound gas, on the perovskite structure compound layer to form an active layer, wherein the active layer has a mesophase structure of an organic amine compound and a perovskite structure compound; and
   forming an electron transport layer on the active layer.

7. The method of fabricating the light emitting diode according to claim 6, wherein the organic amine compound gas is selected from alkylamine gas or alkylenediamine gas.

8. The method of fabricating the light emitting diode according to claim 6, wherein the hole transport layer is formed of nickel oxide, wherein the nickel oxide is NiO, $Ni_2O_3$ or a complex thereof.

9. The method of fabricating the light emitting diode according to claim 6, wherein the electron transport layer is formed of TPBi, Bphen, BCP, TpPyPB, DPPS, or ZnO.

10. The method of fabricating the light emitting diode according to claim 6, wherein a structural formula of the perovskite structure compound is $AMX_3$, wherein A is selected from group IA metal, H, $NH_4$, alkylamine, or alkylenediamine; M is Pb, Sn, or Ge; and X is Cl, Br, or I.

* * * * *